(12) United States Patent
Adamski

(10) Patent No.: US 10,148,234 B2
(45) Date of Patent: Dec. 4, 2018

(54) DEVICE STACK WITH NOVEL GATE CAPACITOR TOPOLOGY

(71) Applicant: pSemi Corporation, San Diego, CA (US)

(72) Inventor: Jaroslaw Adamski, Streamwood, IL (US)

(73) Assignee: pSemi Corporation, San Diego, CA (US)

(*) Notice: Subject to any disclaimer, the term of this patent is extended or adjusted under 35 U.S.C. 154(b) by 0 days.

(21) Appl. No.: 15/951,085

(22) Filed: Apr. 11, 2018

(65) Prior Publication Data

US 2018/0294782 A1   Oct. 11, 2018

Related U.S. Application Data

(63) Continuation of application No. 15/481,276, filed on Apr. 6, 2017, now Pat. No. 9,948,252.

(51) Int. Cl.
*H03F 3/21* (2006.01)
*H03F 3/30* (2006.01)
(Continued)

(52) U.S. Cl.
CPC ........... *H03F 3/211* (2013.01); *H03F 1/0227* (2013.01); *H03F 1/0244* (2013.01); *H03F 1/223* (2013.01);
(Continued)

(58) Field of Classification Search
CPC ..................................................... H03F 3/211
See application file for complete search history.

(56) References Cited

U.S. PATENT DOCUMENTS 7,126,427 B2 * 10/2006 Aoki .................. H03F 1/22
330/311
7,737,790 B1   6/2010 Chen et al.
(Continued)

FOREIGN PATENT DOCUMENTS

JP            879035         3/1996

OTHER PUBLICATIONS

Nguyen, Patricia T., Notice of Allowance received from the USPTO dated Feb. 1, 2018 for U.S. Appl. No. 15/481,276, 17 pgs.
(Continued)

*Primary Examiner* — Patricia T Nguyen
(74) *Attorney, Agent, or Firm* — Jaquez Land Greenhaus LLP; Martin J. Jaquez, Esq.; Alessandro Steinfl, Esq.

(57) ABSTRACT

Systems, methods and apparatus for practical realization of an integrated circuit comprising a stack of transistors operating as an RF amplifier are described. As stack height is increased, capacitance values of gate capacitors used to provide a desired distribution of an RF voltage at the output of the amplifier across the stack may decrease to values approaching parasitic/stray capacitance values present in the integrated circuit which may render the practical realization of the integrated circuit difficult. Coupling of an RF gate voltage at the gate of one transistor of the stack to a gate of a different transistor of the stack can allow for an increase in the capacitance value of the gate capacitor of the different transistor for obtaining an RF voltage at the gate of the different transistor according to the desired distribution.

14 Claims, 14 Drawing Sheets

(51) Int. Cl.
*H03F 1/02* (2006.01)
*H03F 1/22* (2006.01)

(52) U.S. Cl.
CPC ......... *H03F 3/3008* (2013.01); *H03F 3/3037* (2013.01); *H03F 2200/451* (2013.01)

(56) References Cited

U.S. PATENT DOCUMENTS

| | | | |
|---|---|---|---|
| 7,821,349 B2 * | 10/2010 | Park | H03F 1/223 330/302 |
| 9,673,853 B2 | 6/2017 | Blum | |
| 9,948,252 B1 | 4/2018 | Adamski | |
| 2005/0285684 A1 | 12/2005 | Burgener et al. | |
| 2006/0226910 A1 | 10/2006 | Tanoi | |
| 2009/0085670 A1 * | 4/2009 | Jeong | H03F 1/223 330/302 |
| 2010/0001800 A1 | 1/2010 | Milkov | |
| 2010/0060362 A1 | 3/2010 | Kanaya et al. | |
| 2010/0237942 A1 | 9/2010 | Li et al. | |
| 2011/0043284 A1 | 2/2011 | Zhao et al. | |
| 2012/0268205 A1 | 10/2012 | Presti | |
| 2014/0139288 A1 * | 5/2014 | Cha | H03F 3/245 330/254 |
| 2015/0311895 A1 * | 10/2015 | Ali | H03K 19/017509 327/319 |
| 2016/0056779 A1 * | 2/2016 | Cabanillas | H03F 1/0222 330/297 |
| 2016/0079923 A1 | 3/2016 | Jin | |
| 2016/0349785 A1 | 12/2016 | Ciubotaru | |
| 2016/0365859 A1 | 12/2016 | Song et al. | |
| 2017/0133989 A1 * | 5/2017 | Dykstra | H03F 1/3205 |

OTHER PUBLICATIONS

Klag, Brigitta, International Search Report and Written Opinion received from the EPO dated Jun. 29, 2018 for appln. No. PCT/US2018/025761, 11 pgs.

* cited by examiner

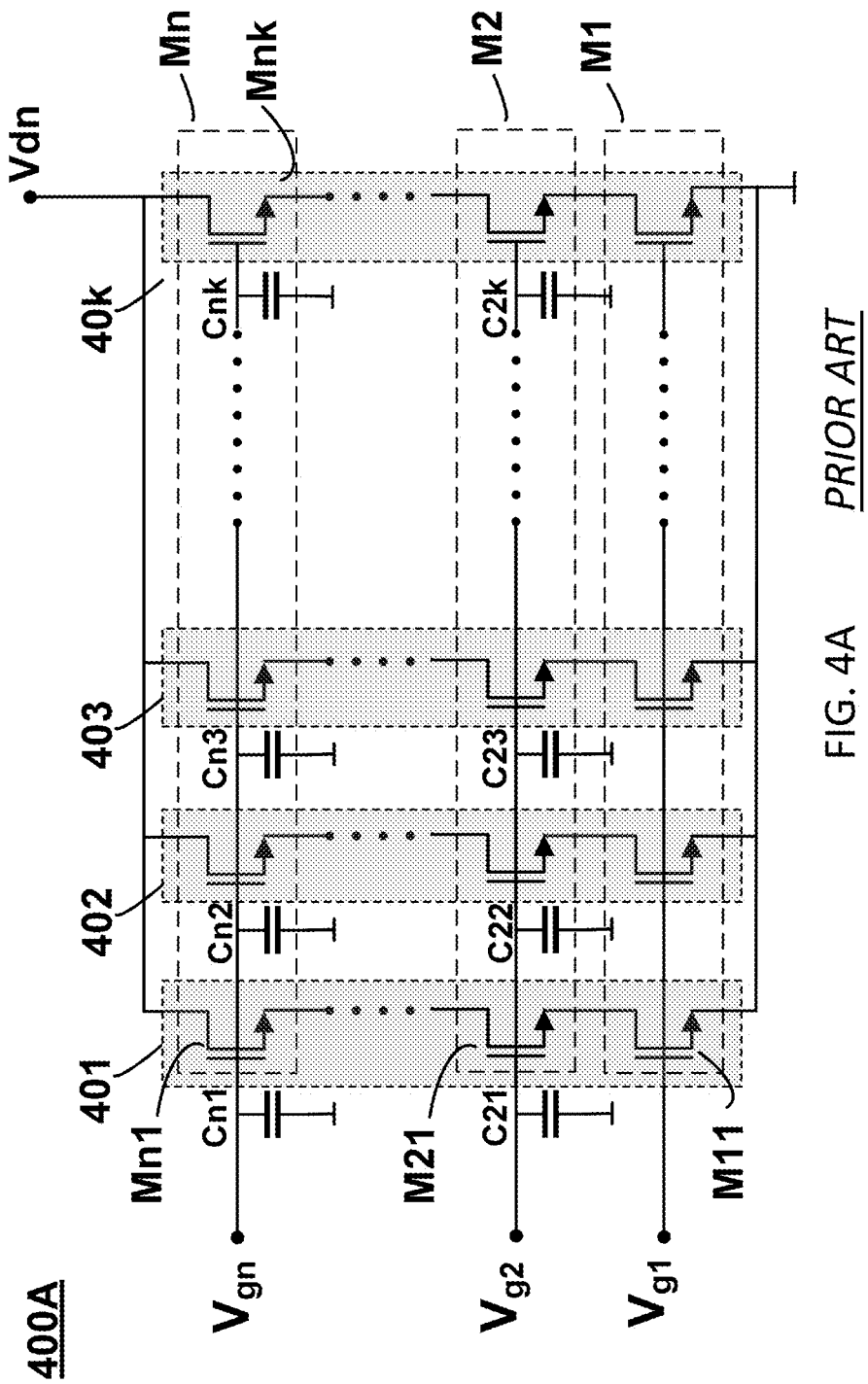
FIG. 4A  *PRIOR ART*

DEVICE STACK WITH NOVEL GATE CAPACITOR TOPOLOGY

CROSS-REFERENCE TO RELATED APPLICATIONS—CLAIM OF PRIORITY

The present application is a continuation of co-pending U.S. application Ser. No. 15/481,276, filed Apr. 6, 2017, entitled "Device Stack with Novel Gate Capacitor Topology", which is herein incorporated by reference in its entirety.

The present application may be related to U.S. Pat. No. 7,248,120, issued on Jul. 24, 2007, entitled "Stacked Transistor Method and Apparatus", the disclosure of which is incorporated herein by reference in its entirety. The present application may also be related to Published US Application No. 2015/0270806 A1, published Sep. 24, 2015, entitled "Bias Control for Stacked Transistor Configuration", the disclosure of which is incorporated herein by reference in its entirety. The present application may also be related to Published US Application No. US 2014/0184336 A1, published Jul. 3, 2014, entitled "Amplifier Dynamic Bias Adjustment for Envelope Tracking", the disclosure of which is incorporated herein by reference in its entirety. The present application may also be related to U.S. Pat. No. 9,219,445 entitled "Optimization Methods for Amplifiers with Variable Supply Power", issued Dec. 22, 2015, the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety. The present application may also be related to Published US Application No. 2014/0184335 A1, entitled "Amplifiers Operating in Envelope Tracking Mode or Non-Envelope Tracking Mode", the disclosure of which is incorporated herein by reference in its entirety. The present application may also be related to Published US Application No. 2014/0184337 A1, entitled "Control Systems and Methods for Power Amplifiers Operating in Envelope Tracking Mode", the disclosure of which is incorporated herein by reference in its entirety.

TECHNICAL FIELD

The present application generally relates to electronic circuits, and more specifically to amplifiers using a plurality of stacked transistors operating in a cascode configuration and monolithic integration thereof.

BACKGROUND

The above referenced U.S. Pat. No. 7,248,120 discusses integrated amplifier circuits using stacked transistors, such as FET transistors, that can be used to control signals that substantially exceed the voltage withstand capability of the individual transistors of the stack. Accordingly, a stack of transistors can operate from a higher supply voltage to provide a higher output power while operating the individual transistors of the stack within their voltage withstand capabilities. A number of the transistors of the stack may be selected according to the supply voltage, the voltage withstand capability of the transistors, and a desired distribution, such as for example, an equal distribution, of the supply voltage across the transistors of the stack. Biasing of the transistors of the stack can provide the desired distribution of the supply voltage across the transistors of the stack. As an output RF signal from the stack responsive to an input RF signal may have an (AC) voltage substantially larger than the (DC) supply voltage to the stack, the above referenced U.S. Pat. No. 7,248,120 uses (bypass) gate capacitors at the gates of cascode transistors of the stack to allow the gates of the cascode transistors to "float" with the RF signal and therefore maintain a distribution of the voltage of the output RF signal across the transistors of the stack for safe operation of the transistors. As described in the U.S. Pat. No. 7,248,120, capacitance values of said gate capacitors are inversely proportional to a position of a corresponding transistor in the stack; gate capacitors of transistors of the stack have decreasing capacitance values as the transistors get closer to the output of the stack. As the number of the transistors in the stack increases, capacitance values of the gate capacitors associated to transistors closer to the output of the stack can decrease to values that may approach values corresponding to stray/parasitic capacitance in the physical layout of the amplifier circuit, thereby rendering practical realization of such circuit challenging. It is desirable to provide an alternative stack topology that allows practical realization of large stack heights in integrated circuits operable as amplifiers.

SUMMARY

According to a first aspect of the present disclosure, monolithically integrated circuital arrangement is presented, the monolithically integrated arrangement comprising: a stack of a plurality of transistors arranged in a cascode configuration, comprising an input transistor and N cascode transistors comprising an output transistor, N being an integer equal to or larger than two, the stack configured to operate between a supply voltage provided at a drain of the output transistor and a reference voltage provided at a source of the input transistor; N gate capacitors, each gate capacitor of the N gate capacitors connected, at a first terminal of the each gate capacitor, to a gate of a respective transistor of the N cascode transistors, wherein at least one gate capacitor of the N gate capacitors is connected, at a second terminal of the at least one gate capacitor, to a first terminal of a coupling gate capacitor of the N gate capacitors, and remaining gate capacitors of the N gate capacitors are connected, at a second terminal of each gate capacitor of the remaining gate capacitors, to the reference voltage.

According to a second aspect of the present disclosure, a monolithically integrated circuital arrangement is presented, comprising: a stack of N transistors arranged in a cascode configuration, comprising an input transistor, $M_1$, and N−1 cascode transistors, $M_2, M_3, \ldots, M_N$, comprising an output transistor, $M_N$, N being an integer equal to or larger than two, the stack configured to operate between a supply voltage provided at a drain of the output transistor, $M_N$, and a reference voltage provided at a source of the input transistor, $M_1$; N−1 gate capacitors, $C_2, C_3, \ldots, C_{N-1}$, each gate capacitor, $C_i$, of the N−1 gate capacitors connected, at a first terminal of the each gate capacitor, $C_i$, to a gate of a respective transistor, $M_1$, of the N−1 cascode transistors, wherein at least one gate capacitor, $C_k$, of the N−1 gate capacitors associated to a transistor $M_k$, is connected, at a second terminal of the at least one gate capacitor, $C_k$, to a first terminal of a coupling gate capacitor, $C_{k-1}$, of the N−1 gate capacitors associated to a transistor $M_{k-1}$ adjacent to the transistors $M_k$, and remaining gate capacitors, $C_2, C_3, \ldots, C_{k-2}, C_{k-1}, C_{k+1}, \ldots, C_N$, of the N−1 gate capacitors are connected, at a second terminal of each gate capacitor of the remaining gate capacitors, to the reference voltage.

According to a third aspect of the present disclosure, a monolithically integrated circuital arrangement is presented, comprising: a stack of a plurality of transistors arranged in a cascode configuration, comprising an input transistor and a plurality of cascode transistors; a first gate capacitor connected between a gate of a first cascode transistor of the plurality of cascode transistors of the stack and a reference voltage, the first gate capacitor configured to provide a first RF voltage at the gate of the first cascode transistor by way of coupling of an RF voltage at a source of the first cascode transistor; and a second gate capacitor connected between a gate of a second cascode transistor of the plurality of cascode transistor of the stack and the gate of the first cascode transistor, the second gate capacitor configured to couple the first RF voltage to the gate of the second cascode transistor and to further couple an RF voltage at a source of the second cascode transistor to the gate of the second cascode transistor to provide a second RF voltage at the gate of the second cascode transistor, wherein the first RF voltage and the second RF voltage are based on a desired distribution of an RF voltage at an output of the stack across the plurality of transistors of the stack.

According to a fourth aspect of the present disclosure, a method for realizing a monolithically integrated circuit comprising a stack of a plurality of transistors arranged in a cascode configuration is presented, the method comprising: connecting a first gate capacitor between a gate of a first cascode transistor of the stack and a reference voltage; based on the connecting, coupling an RF voltage at a source of the first cascode transistor to the gate of the first cascode transistor, thereby obtaining a first RF voltage at the gate of the first cascode transistor; connecting a second gate capacitor between a gate of a second cascode transistor of the stack and the gate of the first cascode transistor; based on the connecting of the second gate capacitor, coupling the first RF voltage to the gate of the second cascode transistor; based on the connecting of the second gate capacitor, further coupling an RF voltage at a source of the second cascode transistor to the gate of the second cascode transistor; and based on the further coupling, obtaining a second RF voltage at the gate of the second cascode transistor.

The details of one or more embodiments of the invention are set forth in the accompanying drawings and the description below. Other features, objects, and advantages of the invention will be apparent from the description and drawings, and from the claims.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 4A shows a simplified schematic representation of an exemplary implementation (400A) of the RF amplifier (100) depicted in FIG. 1, expanded to n stacked transistors (M1, M2, . . . , Mn) instead of six. As can be seen in FIG. 4A, the RF amplifier (100) can comprise a plurality, k, of unit cells (401, 402, . . . , 40k) coupled in a parallel configuration, each unit cell comprising a reduced size transistor stack comprising reduced size transistors (e.g. transistors M11, M21, . . . , Mn1 for unit cell 401). The reduced size transistor stack may be considered a reduced size replica of the transistor stack (M1, M2, . . . , Mn). The reduced size transistors may each be considered a transistor unit element; each transistor (M1, M2, . . . , Mn) of the stack being represented by k parallel transistor units (e.g. M1=Mn1//Mn2// . . . //Mnk). Gate capacitors (C2, C3, . . . , Cn) to the gates of the transistors (M1, M2, . . . , Mn) of the stack are distributed across the unit cells (401, 402, . . . , 40k). For example, gate capacitor Cn to the gate of the output transistor Mn is distributed across capacitors (Cn1, Cn2, . . . , Cnk) respectively coupled to transistor unit elements (Mn1, Mn2, . . . , Mnk) of the output transistor Mn, where Cn=Cn1//Cn2// . . . //Cnk.

Like reference numbers and designations in the various drawings indicate like elements.

DETAILED DESCRIPTION

Figure 1:
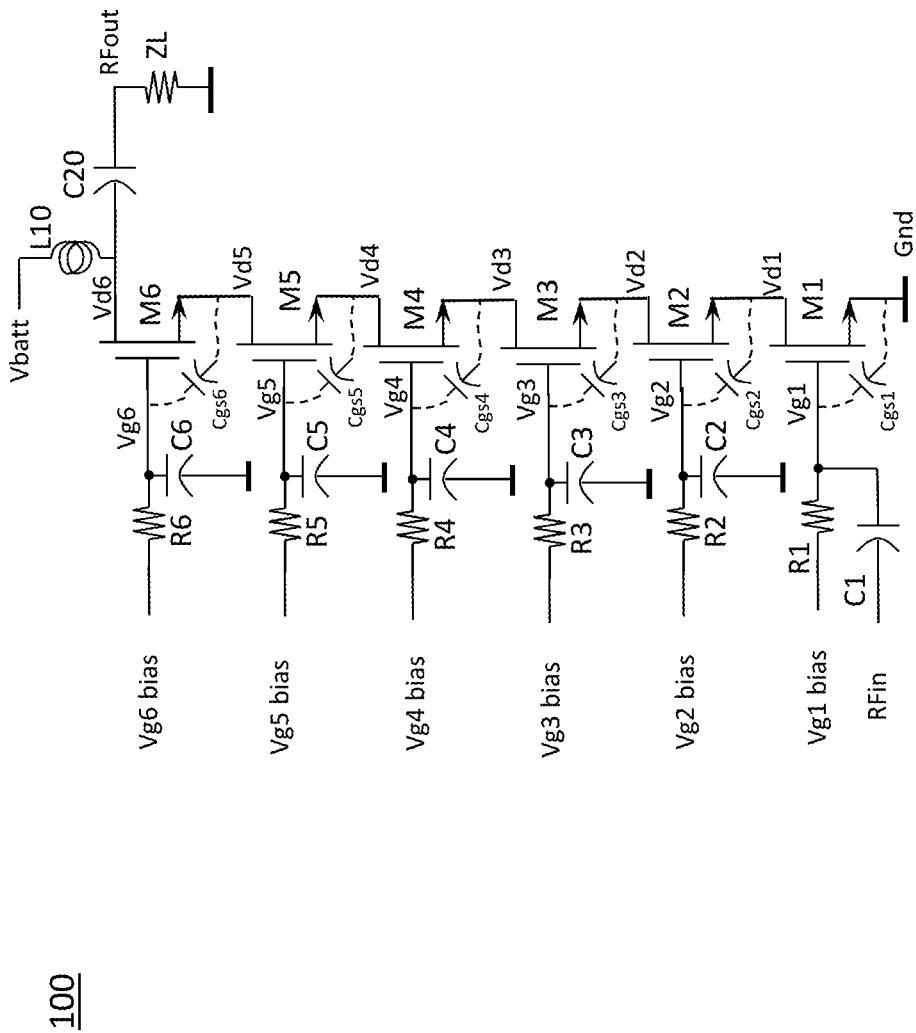
FIG. 1 shows a simplified schematic representation of a prior art radio frequency (RF) amplifier (100) using a transistor stack comprising a plurality of series connected transistors (M1, . . . , M6), comprising an input transistor (M1), an output transistor M6, and cascode transistors (M2, . . . , M6). Basing voltages (Vg2 bias, . . . , Vg6 bias) to the cascode transistors provide a desired distribution of a supply voltage, Vbatt, across the transistors of the stack, while gate capacitors (C2, . . . , C6), coupled to the gates of the cascode transistors (M2, . . . , M6), maintain a desired distribution of an RF voltage at a drain of the output transistor M6 across the transistors of the stack.

FIG. 1 shows a simplified schematic representation of a prior art radio frequency (RF) amplifier (100) using a transistor stack arranged in a cascode configuration comprising a plurality of series connected transistors (M1, ..., M6), comprising an input transistor (M1), an output transistor M6, and cascode transistors (M2, ..., M6). Power to the stack is provided via a supply voltage, Vbatt, coupled to the output transistor M6 through an inductor L10, and referenced to a reference potential, Gnd, coupled to a source of the input transistor M1. An input signal, RFin, provided to the input transistor M1 through a DC blocking capacitor, C1, is amplified through the stack and provided at a drain of the output transistor M6, and into a load RL through a DC blocking capacitor C20. Gain of the transistor stack (M1, M2, ..., M6) may be provided by a transconductance of the input transistor M1 based on a biasing of the input transistor, including a gate biasing voltage, Vg1bias, provided to a gate node Vg1 of the input transistor M1. In particular, the voltage at the gate node Vg1 sets a desired (DC) bias current through the stack.

With further reference to FIG. 1, the larger the supply voltage, Vbatt, the larger the number of transistors in the stack needed to support the supply voltage, Vbatt, for a given semiconductor technology, the semiconductor technology establishing a voltage withstand capability (e.g. with respect to a breakdown voltage) of the transistors. The cascode transistors (M2, ..., M6) are biased via bias voltages Vg2bias, ..., Vg6bias, provided to the gate nodes Vg2, ..., Vg6 of the cascode transistors. The bias voltages Vg2bias, ..., Vg6bias are adapted to provide a desired distribution, across the transistors of the stack, of the (DC) voltage at the drain node Vd6 of the output transistor M6 without an input RF signal, RFin, to the input transistor M1. In other words, such bias voltages Vg2bias, ..., Vg6bias are adapted to distribute the voltage provided by the supply voltage, Vbatt, across the transistors (M1, M2, ..., M6) of the stack. Although in most cases the desired distribution may be an equal distribution, other unequal (e.g. asymmetric) distributions may also be possible based on design and performance goals. More information on biasing of the stack, including the input transistor M1 and the cascode transistors (M2, ..., M6) can be found, for example, in the above referenced U.S. Pat. No. 7,248,120 and Published US Application No. 2015/0270806 A1, whose disclosures are incorporated herein by reference in their entirety. As used herein, a withstand voltage may refer to a maximum desired voltage across any two terminals of a transistor (e.g. source, drain, gate) based on a desired performance of the transistor and a breakdown voltage of the transistor. A person skilled in the art would understand that, although a transistor may operate close to a breakdown voltage, the closer the operation of the transistor to the breakdown voltage, the more statistically prone to damage (e.g. shorter life expectancy) the transistor is. The withstand voltage can therefore be defined as a voltage smaller than the breakdown voltage of the transistor that may provide a desired life expectancy and/or performance of the transistor.

With continued reference to FIG. 1, as an input RF signal, RFin, is applied to the gate of the input transistor M1, corresponding RF voltage (i.e. AC voltage) components appear at the drain nodes Vd1, Vd2, ..., Vd6 with increasing amplitudes at the higher nodes. Such RF voltages at the drain nodes Vd1, Vd2, ..., Vd6 can couple to the gate nodes Vg2, Vg3, ..., Vg6 through gate-to-source capacitances Cgs2, Cgs3, ..., Cgs6 whose values are function of a semiconductor technology and a size of corresponding transistors of the stack. It should be noted that transistors (M1, M2, ..., M6) may not necessarily be of a same semiconductor technology and of a same size, as such parameters may vary according to desired design goals and performances of the RF amplifier (100). Resistors (R1, R2, ..., R6) serve to isolate a bias circuit that generates the bias voltages Vg1bias, Vg2bias, ..., Vg6bias from the RF voltages present at the gate nodes Vg1, Vg2, ..., Vg6. It should also be noted that cascode transistors (M2, ..., M6) may have a gate-to-drain capacitance that is not negligible. Such gate-to-drain capacitance may be subjected to a Miller multiplication, which can effectively make such capacitance larger. However, to a first order, the Cgs capacitance, and any capacitance from a gate of a cascode transistor to ground, set an impedance looking into the cascode transistor and thus the voltage at the source node. In practice, a small adjustment may be required to compensate for Cgd effects in order to obtain a desired voltage at the gate node.

As the input RF signal, RFin, to the RF amplifier (100) of FIG. 1 is amplified through the stack, a corresponding amplified RF signal appears at the drain node Vd6 whose RF voltage amplitude, having an AC and a DC component, may be twice as large as the supply voltage, Vbatt. The gate capacitors C2, ..., C6 allow voltages at the gate nodes Vg2, ..., Vg6 to float; that is, let such voltages vary along with the RF signal at the respective drain nodes Vd2, ..., Vd6, which consequently allow control of voltage drops across the transistors of the stack and prevent excess stress (e.g. voltage beyond a withstand voltage) on any transistor of the stack, for a more efficient operation of the stack. In particular, and as described in the above referenced U.S. Pat. No. 7,248,120, which is incorporated herein by reference in its entirety, capacitance values of the gate capacitors C2, ..., C6 are configured to maintain the desired distribution of the RF voltage at the drain node Vd6 across the transistors M1, M2, ..., M6 of the stack, such as, for example, an equal or substantially equal voltage distribution (division) between the transistors M1, M2, ..., M6, by controlling an amplitude of a coupled RF voltage at a gate node Vg2, ..., Vg6 through a corresponding gate-to-source capacitance Cgs2, ..., Cgc6.

In order to provide the desired voltage distribution (e.g. equal voltage distribution) of the RF voltage at the drain node Vd6 across the stack of the RF amplifier (100) of FIG. 1, capacitance values of the gate capacitors C2, ..., C6 become progressively smaller (e.g. inversely proportional to a position of a corresponding transistor in the stack) and may become small enough at the top of the stack that their values may be comparable to parasitic/stray capacitances of a corresponding circuit layout of the stack. The progressively smaller gate capacitors can provide progressively larger voltage swings at the gate nodes Vg2, ..., Vg6 of the transistors M2, ..., M6 to act in unison with the progressively larger voltage swings at drain node Vd1, ..., Vd6 of the transistors M1, ..., M6 to ensure the desired voltage distribution (e.g. equal voltage division across the transistors M1, ..., M6). For example, RF voltage at the drain node Vd5 drives the series connected capacitors C6 and Cgs6. To increase an RF voltage swing at the gate node Vg6, capacitance value of the gate capacitor C6 can be made smaller in reference to a capacitance value of the capacitor Cgs6.

Figure 4B:
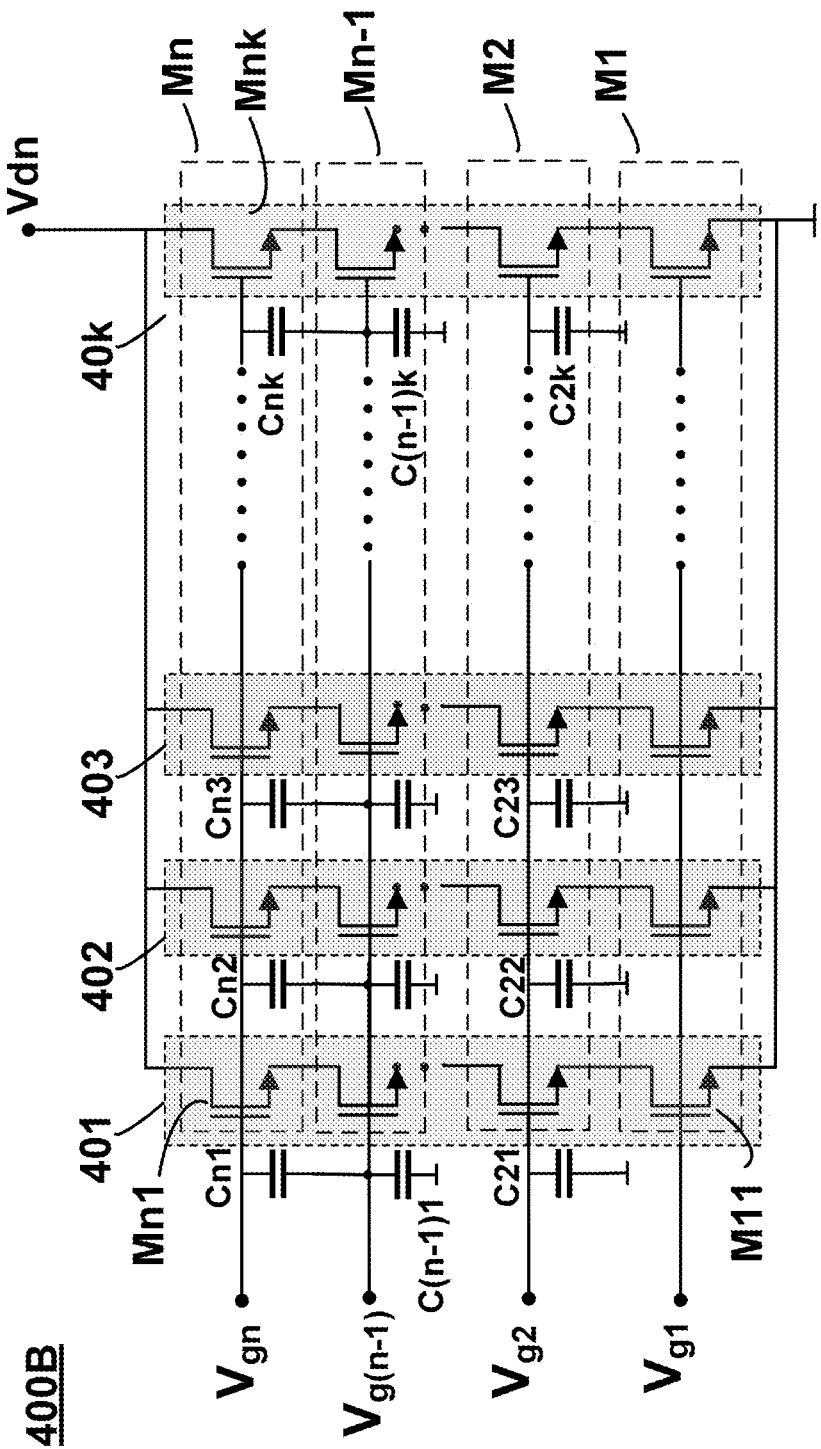
FIG. 4B shows a simplified schematic representation of an exemplary implementation (400B) of the RF amplifier (200) depicted in FIG. 2, expanded to n stacked transistors (M1, M2, . . . , Mn) instead of six. This representation is similar to one depicted in FIG. 4B with respect to the prior art RF amplifier (100). As can be seen in FIG. 4B, gate capacitors Cn and C(n−1) are coupled to one another by way of their distributed capacitors (Cn1, Cn2, . . . , Cnk) and (C(n−1)1, C(n−1)2, . . . , C(n−1)k), where distributed capacitor pairs (Cn1, C(n−1),1), (Cn2, C(n−1),2), . . . , (Cnk, C(n−1),k) are coupled.

In an exemplary case where the RF amplifier (100) of FIG. 1 has a total size of 20 mm with transistors M1, ..., M6 each having a gate length of 0.11 µm, capacitance value of C6 may be in the order of 1.5 pF for an equal voltage distribution across the transistors M1, ..., M6. Such low value capacitance is comparable with the layout parasitic/stray capacitance of the RF amplifier circuit. A person skilled in the art would know that a total size of the RF amplifier (100) may be related to a number k of unit cells (401, 402, ..., 40k) of the transistor stack M1, ..., M6 as depicted in FIGS. 4A and 4B later described. According to one exemplary embodiment of the present disclosure, capacitance values of the gate capacitors C2, ..., C6 for a given desired distribution may be provided through the aid of a circuit simulation software tool fitted with optimization capability. Simulation goals may be set to achieve the desired voltage distribution, such as, for example, an equal voltage division, during normal operation of the RF amplifier circuit. Although capacitance values of such gate capacitors may be pre-calculated for a given voltage distribution, simulation with extracted parasitic/stray capacitances and re-optimization of the capacitance values of the gate capacitors while taking into consideration such extracted parasitic/stray capacitances may still be desired.

As capacitance values of the gate capacitors of the upper transistors of the stack (e.g. M5, M6) depicted in FIG. 1 approach the parasitic/stray capacitances, design of the stack for a desired voltage distribution may become more difficult and less predictable, and in some cases even impossible, since the parasitic/stray capacitances may have values greater than the gate capacitances. The various stack topologies according to the present teachings, (e.g. FIG. 2 and beyond, later described) allow for larger gate capacitance values for a given desired voltage distribution and a given semiconductor technology and transistor sizes of the stack, as compared to the prior art configuration of FIG. 1. This in turn allows realization of larger stack heights for a larger output power of the RF amplifier, or for a usage of a larger number of smaller size transistor devices (e.g. with smaller withstand voltage) for a given output power of the RF amplifier.

Figure 2:
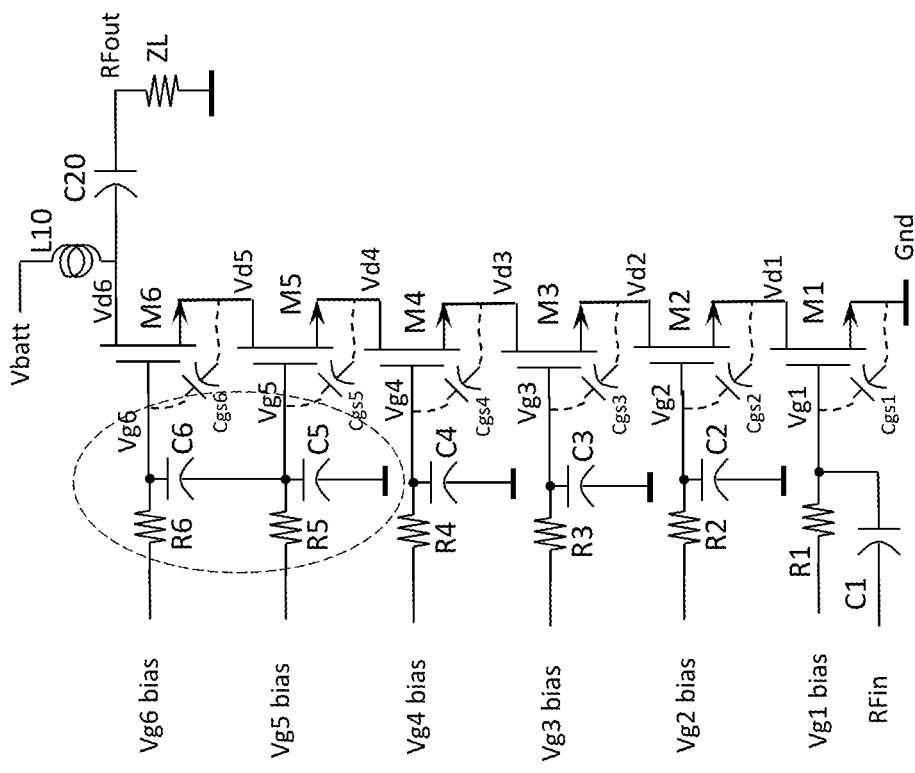
FIG. 2 shows a simplified schematic representation of an RF amplifier (200) according to an embodiment of the present disclosure, based on the prior art RF amplifier (100) of FIG. 1, where gate capacitors of two adjacent transistors of a stack of six transistors are coupled to allow for higher capacitance values of the gate capacitors while maintaining the desired distribution of the RF voltage at the drain of the output transistor M6 across the transistors of the stack. In the exemplary embodiment depicted in FIG. 2, the gate capacitor C6 of the output transistor M6 is coupled to the gate capacitor C5 of the transistor M5.

FIG. 2 shows a simplified schematic representation of an RF amplifier (200) according to an embodiment of the present disclosure, based on the prior art RF amplifier (100) of FIG. 1, where a desired distribution of the RF voltage at the drain Vd6 of the output transistor M6 across the transistors M1, M2, ..., M6 of the stack may be provided with larger capacitance values of the gate capacitors C2, C3, ..., C6 when compared to the configuration depicted in FIG. 1. Similarly to the configuration depicted in FIG. 1, the stack configuration depicted in FIG. 2 may be used for any desired voltage distribution, equal or unequal, and using transistors according to a same or different semiconductor technologies and/or sizes.

With continued reference to the RF amplifier (200) according to the present disclosure depicted in FIG. 2, in order to provide the desired voltage distribution across the stack, a voltage swing at the gate nodes Vg2, ..., Vg6 of the transistors M2, ..., M6 can be made to be progressively larger to act in unison with the progressively larger voltage swings at drain node Vd1, ..., Vd6 of the transistors M1, ..., M6. Control of the voltage swing at a gate node of a transistor of the stack may be provided by a ratio of capacitance of a gate capacitor and capacitance of a corresponding gate-to-source capacitor (e.g. proportional to Cgsn/Cg).

As can be seen in FIG. 2, the voltage swing at the gate node (Vg2, Vg3, Vg4) of the lower transistors (M2, M3, M4) of the stack is provided by the ratio of the corresponding capacitance pairs (C2, Cgs2), (C3, Cgs3), (C4, Cgs4) which determine a level of coupling of the drain voltage (Vd1, Vd2, Vd3) to the gate node (Vg2, Vg3, Vg4). However, as can be seen in FIG. 2, a voltage swing at the upper gate node Vg6 is made larger by adding to the gate node Vg6 a voltage swing provided at the gate node Vg5, which therefore decreases a required level of coupling of the drain voltage Vd5 to the gate node Vg6 for a given desired voltage swing at the gate node Vg6. In other words, by adding a voltage at the gate node Vg5 to the gate node Vg6, a larger gate capacitor C6 may be used to provide a desired voltage swing at the gate node Vg6. Similarly, coupling of the two gate nodes (Vg5, Vg6) via the two gate capacitors (C5, C6) also increases the voltage swing at the gate node Vg5 and therefore a larger gate capacitor C5 may be used for a given desired voltage swing at the gate node Vg5. As used herein, the gate capacitor C5 which is connected to the gate node Vg5 and is coupled to the gate node Vg6 via its connection to the gate capacitor C6 may be referred to as a "coupling gate capacitor".

Figure 3:
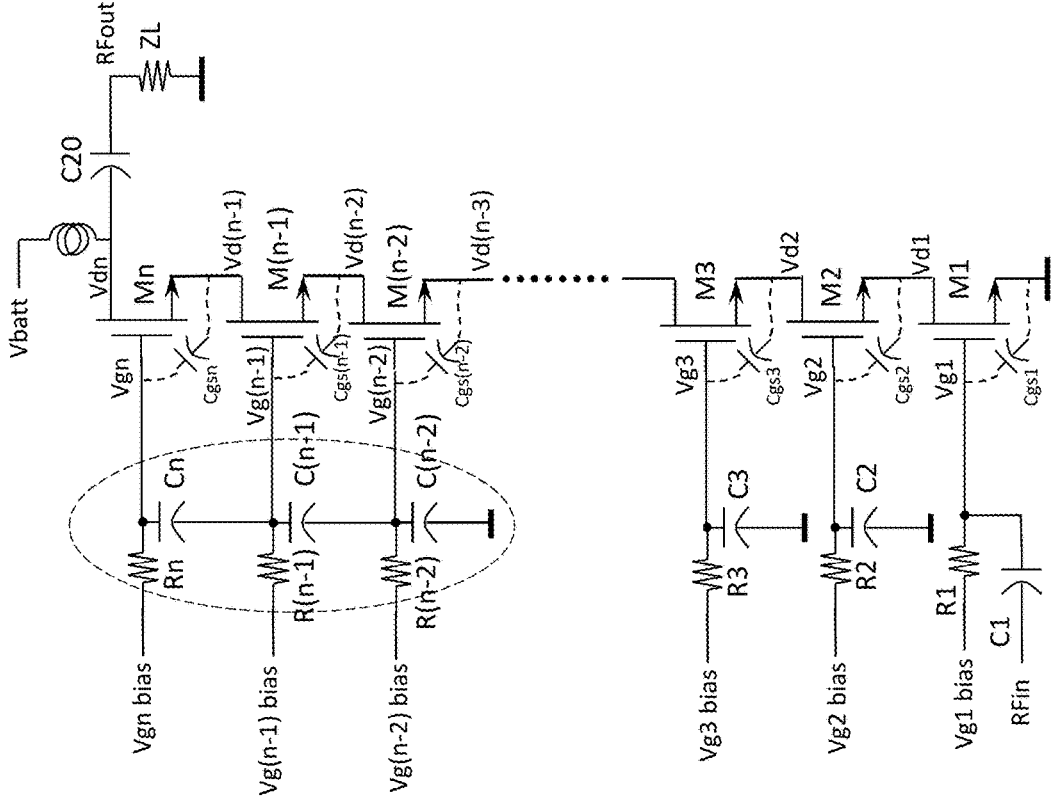
FIG. 3 shows a simplified schematic representation of an RF amplifier (300) according to an embodiment of the present disclosure, based on the embodiment of FIG. 2, where gate capacitors of adjacent transistors of a transistor stack comprising n transistors are coupled to allow for higher capacitance values of the gate capacitors while maintaining the desired distribution of the RF voltage at the drain of the output transistor Mn across the n transistors of the stack. In the exemplary embodiment depicted in FIG. 3, the gate capacitor Cn of the output transistor Mn is coupled to the gate capacitor C(n−1) of the transistor M(n−1) and to the gate capacitor C(n−2) of the transistor M(n−2).

The gate capacitor topology according to the present disclosure depicted in FIG. 2, may allow for the use of larger gate capacitors (C5, C6) for the upper transistors (M5, M6) of the stack with capacitance values substantially larger than the parasitic/stray capacitances of a corresponding circuit layout, while providing a desired distribution of the RF voltage at the drain node of the output transistor (e.g. M6) across the transistors (M1, M2, ..., M6) of the stack. The teachings, according to the present disclosure, can therefore allow for realization of higher stack heights, where the stack height, n, can be any integer values larger than two, such as, for example, 3, 4, 5, 6, 7, 8, 9, etc., as depicted in FIG. 3. As the stack height n increases, it may be desirable to apply the present teachings to more than the upper two transistors of the stack. According to an exemplary embodiment of the RF amplifier (200) of FIG. 2, where n=6, gate capacitance values of (30.0 pF, 7.51 pF, 4.08 pF, 5.37 pF, 8.25 pF) for the gate capacitors (C2, C3, C4, C5, C6) can be provided for an equal distribution of an RF voltage at the drain node Vd6, instead of gate capacitance values of (30.1 pF, 7.99 pF, 3.93 pF, 2.62 pF, 1.93 pF) provided for the prior art configuration depicted in FIG. 1. A person skilled in the art would appreciate the substantially larger capacitance values of the upper gate capacitors (C5, C6) in the configuration according to the present disclosure depicted in FIG. 2 when compared to the prior art configuration of FIG. 1.

FIG. 3 shows a simplified schematic representation of an RF amplifier (300) according to an embodiment of the present disclosure, based on the RF amplifier (200) of FIG. 2, where a plurality n transistors (M1, M2, ... Mn) are used in a cascode stack configuration. A desired distribution of the RF voltage at the drain Vdn of the output transistor Mn across the transistors M1, M2, ..., Mn of the stack may be provided with larger capacitance values of the gate capacitors C2, C3, ..., Cn when compared to a configuration based on the configuration depicted in FIG. 1. The stack configuration depicted in FIG. 3 may be used for any desired voltage distribution, equal or unequal, and using transistors according to a same or different semiconductor technologies and/or sizes.

As can be seen in FIG. 3, by coupling the gate capacitors (C(n−2), C(n−1), Cn) of the upper transistors (M(n−2), M(n−1), Mn) of the stack (M1, M2, ..., Mn), a corresponding added voltage swing at any of the gate nodes (Vg(n−2), Vg(n−1), Vgn) can allow for a larger gate capacitance value of said gate capacitors, as described with respect to the capacitors (C5, C6) of FIG. 2, for a given desired distribution of the RF voltage at the drain node Vdn of the output transistor Mn across the transistors (M1, M2, ..., Mn) of the stack. In a case where the cascode stack comprises a plurality, k, of unit cells, as depicted in FIGS. 4A and 4B, such larger capacitance values (C1, C2, ..., Cn) may be distributed across the plurality of unit cells (401, 402, ..., 40k) while maintaining capacitance values (e.g. Cn1, Cn2, ..., Cnk) coupled to gates of each of the plurality of unit cells to values larger than values of parasitic/stray capacitances corresponding to circuit layout of the unit cells.

FIG. 4A shows a simplified schematic representation of an exemplary implementation (400A) of the RF amplifier (100) depicted in FIG. 1, expanded to n stacked transistors (M1, M2, ..., Mn), where n can be any integer larger than 2. As can be seen in FIG. 4A, the RF amplifier (100) can comprise a plurality, k, of unit cells (401, 402, ..., 40k) coupled in a parallel configuration, each unit cell (e.g. 401) comprising a reduced size transistor stack comprising reduced size transistors (e.g. transistors M11, M21, ..., Mn1 for unit cell 401). The reduced size transistors may each be considered a transistor unit element; each transistor (M1, M2, ..., Mn) of the stack being represented by k parallel transistor units (e.g. M1=Mn1//Mn2// ... //Mnk). Although not shown in FIG. 4A, a person skilled in the art readily understands that each of the transistor unit elements (e.g. Mn1, Mn2, ..., Mnk of the transistor Mn) may inherently include a gate-to-source capacitance that is a function of a corresponding semiconductor technology of each transistor unit element, where the totality of such gate-to-source capacitances (i.e. parallel equivalent) make up transistor's M1 gate-to-source capacitance Cgsn depicted in FIG. 3. Gate capacitors (C2, C3, ..., Cn) coupled to the gates of the transistors (M1, M2, ..., Mn) of the stack are distributed across the unit cells (401, 402, ..., 40k). For example, gate capacitor Cn coupled to the gate of the output transistor Mn is distributed across capacitors (Cn1, Cn2, ..., Cnk) respectively coupled to transistor unit elements (Mn1, Mn2, ..., Mnk) of the output transistor Mn, where Cn=Cn1//Cn2// ... //Cnk.

With further reference to FIG. 4A, a person skilled in the art readily understands that the distribution of the gate capacitors (C2, C3, ..., Cn) across the unit cells (401, 402, ..., 40k) can reduce the effects of parasitic/stray capacitances over the capacitance values of such gate capacitors by reducing lengths of traces between the gate capacitors and the associated transistors' gates in the plurality of unit cells. However, as described above, with increasing heights of the stack (larger values of n), gate capacitance values of the upper transistors of the stack (e.g. Mn, M(n−1), . . . ) can decrease for a given desired distribution, and therefore effect of such decrease can be further magnified by the desire to distribute the gate capacitors across the plurality of unit cells. It follows that according to an embodiment of the present disclosure, capacitance values of the gate capacitors (Cn, C(n−1), . . . ) of the upper transistors (Mn, M(n−1), . . . ) of the stack (M1, M2, . . . , Mn) can be increased by coupling gate voltages of adjacent transistors of the stack, via coupling of gate capacitors, in a similar manner as described above in relation to the gate capacitors (C5, C6) of FIG. 2. By increasing capacitance values of such gate capacitors, corresponding distributed gate capacitance values can have values larger than the above mentioned parasitic/stray capacitances. For example, as shown in FIG. 4B, coupling of the gate capacitors (C(n−1), Cn), via coupling of corresponding distributed capacitors, provides added voltage swings at the gate nodes (Vg(n−1), Vgn) and therefore allows for larger total capacitance values coupled to such gate nodes, where the total capacitance values are provided via distributed capacitances (Cn1, Cn2, . . . , Cnk) associated to the gate capacitor Cn, and distributed capacitances (C(n−1)1, C(n−1)2, C(n−1)k) associated to the gate capacitor C(n−1). It should be noted that although, in the exemplary embodiment according to the present disclosure depicted in FIG. 4B, gate capacitors C(n−1)j of each unit element M(n−1)j of the k unit elements M(n−1)j (j=1 to k) that form the transistor M(n−1), are shown coupled to corresponding gate capacitors of each unit element Mnj that form the transistor Mn, other exemplary embodiments where only some and not all of such capacitor couplings between corresponding unit elements of the transistors M(n−1) and Mn are also possible.

Figure 5A:
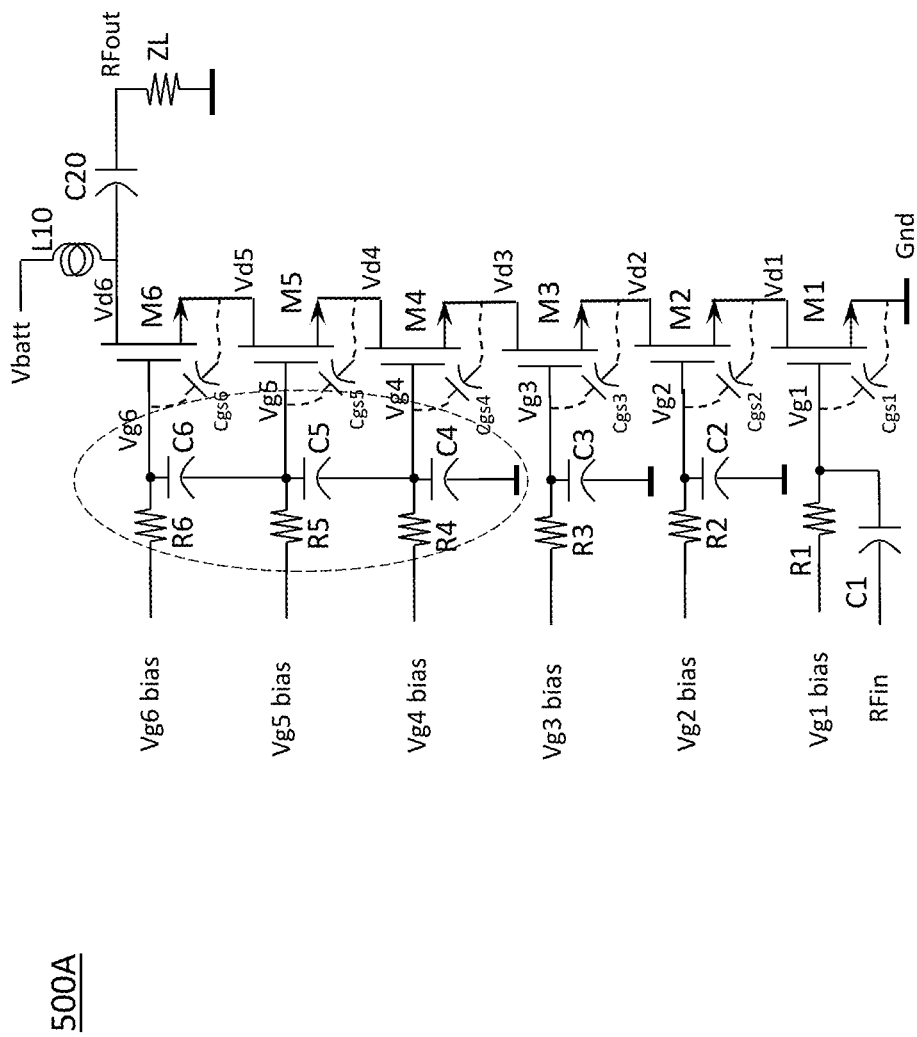
FIG. 5A shows a simplified schematic representation of an RF amplifier (400A) according to an embodiment of the present disclosure, based on the prior art RF amplifier (100) of FIG. 1, where gate capacitors of three adjacent transistors of a stack of six transistors are coupled to allow for higher capacitance values of the gate capacitors while maintaining the desired distribution of the RF voltage at the drain of the output transistor M6 across the transistors of the stack. In the exemplary embodiment depicted in FIG. 5A, the gate capacitor C6 of the output transistor M6 is coupled to the gate capacitor C5 of the transistor M5 and to the gate capacitor C4 of the transistor M4.
Figure 5B:
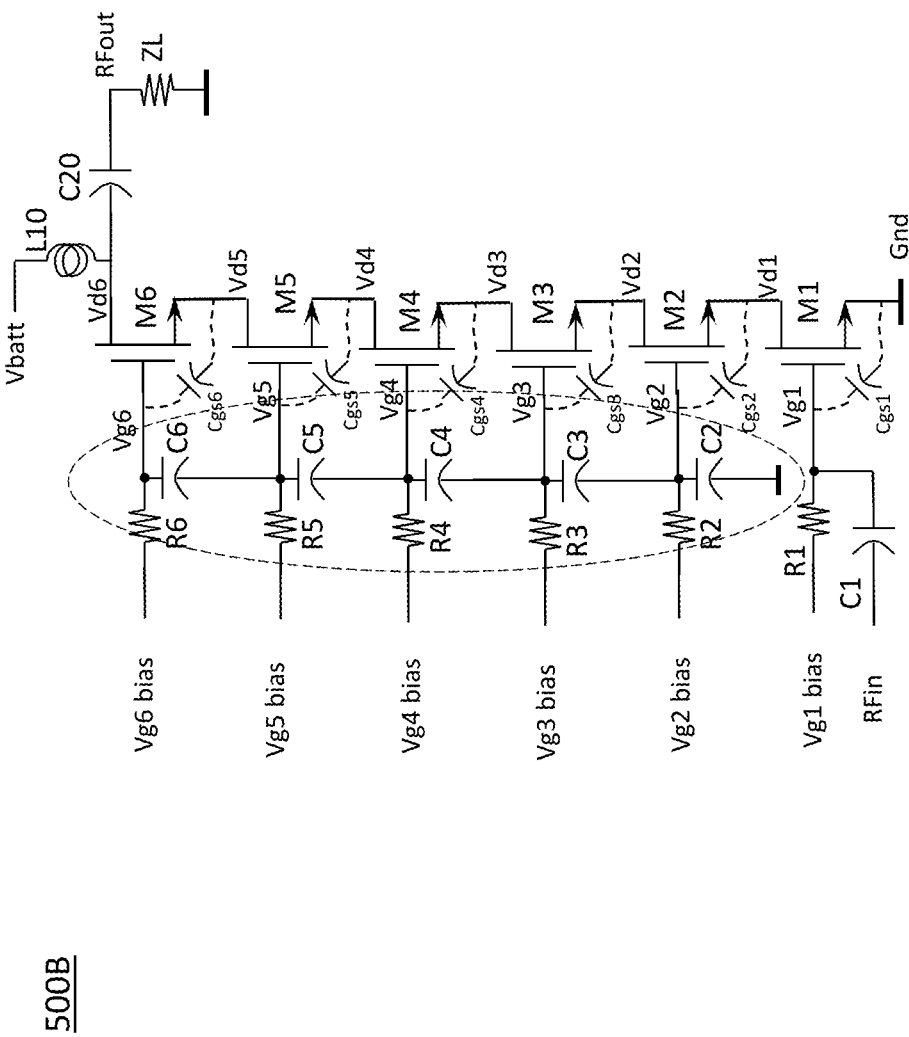
FIG. 5B shows a simplified schematic representation of an RF amplifier (500B) according to an embodiment of the present disclosure, based on the prior art RF amplifier (100) of FIG. 1, where gate capacitors of five adjacent transistors of a stack of six transistors are coupled to allow for higher capacitance values of the gate capacitors while maintaining the desired distribution of the RF voltage at the drain of the output transistor M6 across the transistors of the stack. In the exemplary embodiment depicted in FIG. 5B, the gate capacitor C6 of the output transistor M6 is coupled to the gate capacitor C5 of the transistor M5, to the gate capacitor C4 of the transistor M4, to the gate capacitor C3 of the transistor M3, and to the gate capacitor C2 of the transistor M2.

The gate capacitor topology, according to the present disclosure, allows for practical implementation of increased height cascode stacks. Although upper transistors of the stack may benefit most from the present teachings, as gate capacitance values progressively decrease with higher positions of transistors (closer to the output transistor) in the stack, it should be noted that the present teachings may equally apply to other cascode transistors of the stack, as depicted in the exemplary configurations according to the present disclosure of FIGS. 5A, 5B and FIG. 5C. The exemplary gate topology depicted in FIG. 5A couples gate capacitors (C4, C5, C6) of the top three transistors (M4, M5, M6) of the stack to provide for added voltage swings at the gate nodes (Vg4, Vg5, Vg6) for an increase in gate capacitance values of said gate capacitors. Similarly, the exemplary gate topology depicted in FIG. 5B couples gate capacitors (C2, C3, C4, C5, C6) of all the cascode transistors (M2, M3, M4, M5, M6) of the stack to provide for added voltage swings at the gate nodes (Vg2, Vg3, Vg4, Vg5, Vg6) for an increase in gate capacitance values of said gate capacitors. Finally, the exemplary gate topology depicted in FIG. 5C couples the gate capacitors (Cn, C(n−1), C(n−2)) of the top three transistors (Mn, M(n−1), M(n−2)) and the gate capacitors (C2, C3) of the bottom two (cascode) transistors (M2, M3) of the stack to provide for added voltage swings at the gate nodes (Vgn, Vg(n−1), Vg(n−2)) and (Vg2, Vg3) for an increase in gate capacitance values of said gate capacitors. Such different configurations as depicted in FIGS. 5A, 5B and 5C, may address practical implementation issues in cases where unequal RF voltage distribution may be desired across the transistors of the stack, such as, for example, when transistors of the stack have different withstand voltages and/or are designed for different performances.

Figure 5C:
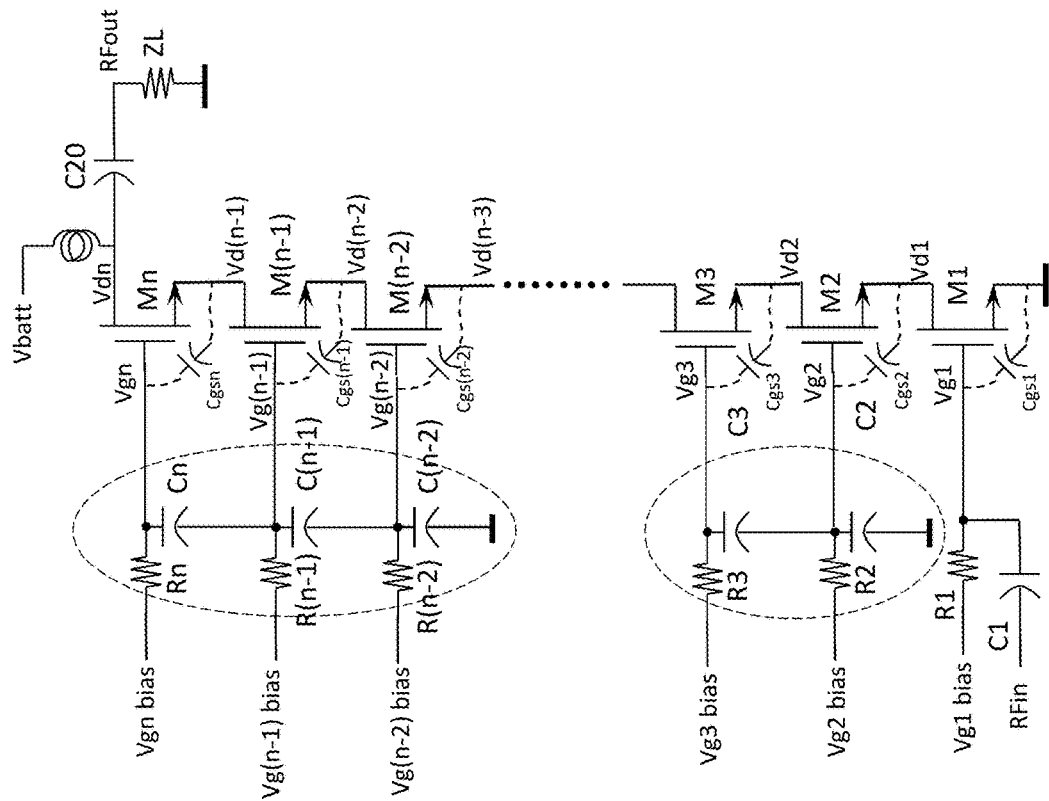
FIG. 5C shows a simplified schematic representation of an RF amplifier (500C) according to an embodiment of the present disclosure, based on the embodiment of FIG. 3, where gate capacitors of adjacent transistors of a transistor stack comprising n transistors are coupled to allow for higher capacitance values of the gate capacitors while maintaining the desired distribution of the RF voltage at the drain of the output transistor Mn across the n transistors of the stack. In the exemplary embodiment depicted in FIG. 5C, the gate capacitor Cn of the output transistor Mn is coupled to the gate capacitor C(n−1) of the transistor M(n−1) and to the gate capacitor C(n−2) of the transistor M(n−2). Additionally, the gate capacitor C3 of the transistor M3 is coupled to the gate capacitor C2 of the transistor M2.

With further reference to the configuration depicted in FIG. 5C, a practical implementation of a corresponding integrated circuit to derive a number of connected gate capacitors, may consider a height, n, of the stack, a gate length of each transistor of the stack (which defines a corresponding gate-to-source capacitance), and an amount of parasitic/stray capacitance expected in a layout of the integrated circuit. Further consideration may be based on a desired distribution of an RF voltage at the top of the stack (output transistor) across the transistors of the stack. For example, for a stack height n=6, with a 10.8 mm transistor device size, and a 130 nm semiconductor process, it may be desirable to connect at least the gate capacitor C6 of the top transistor M6 of the stack according to the topology of the present disclosure, as depicted in FIG. 2, to increase its capacitance value past the expected circuit layout parasitic/stray capacitance. In an exemplary case, this can result in a capacitance value for C6 equal to 8.25 pF instead of a value of 1.93 pF for the prior art configuration of FIG. 1. For a stack height n=7, gate capacitors (C6, C7) of the top two transistors (M6, M7) of the stack may require connection according to the present teachings, as depicted in FIG. 5A, to increase their capacitance values past the expected circuit layout parasitic/stray capacitances and make implementation of the stack more feasible in practice. In an exemplary case, this can result in a respective capacitance value for C6 and C7 equal to 11.43 pF and 5.42 pF instead of a respective value of 1.45 pF and 1.07 pF for the prior art configuration of FIG. 1.

Figure 6B:
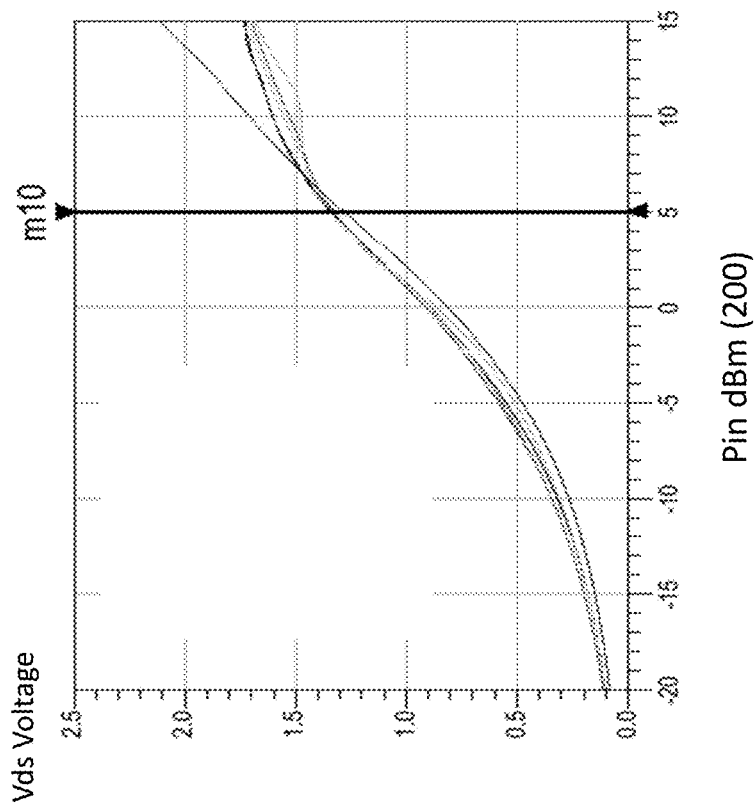
FIGS. 6A, 6B, 6C and 6D shows graphs representing simulated performances of the prior art RF amplifier (100) of FIG. 1 and the RF amplifier (200) according to the present disclosure of FIG. 2. Such simulated performances are based on a distribution of the RF voltage at the drain of the output transistor M6 across the transistors of the stack (FIG. 6A for the RF amplifier 100 and FIG. 6B for the RF amplifier 200), and an output power (dBm) response and power added efficiency (PAE) of the RF amplifiers relative to an input power (dBm) to the amplifiers (FIG. 6C for the RF amplifier 100 and FIG. 6D for the RF amplifier 200).
Figure 6A:
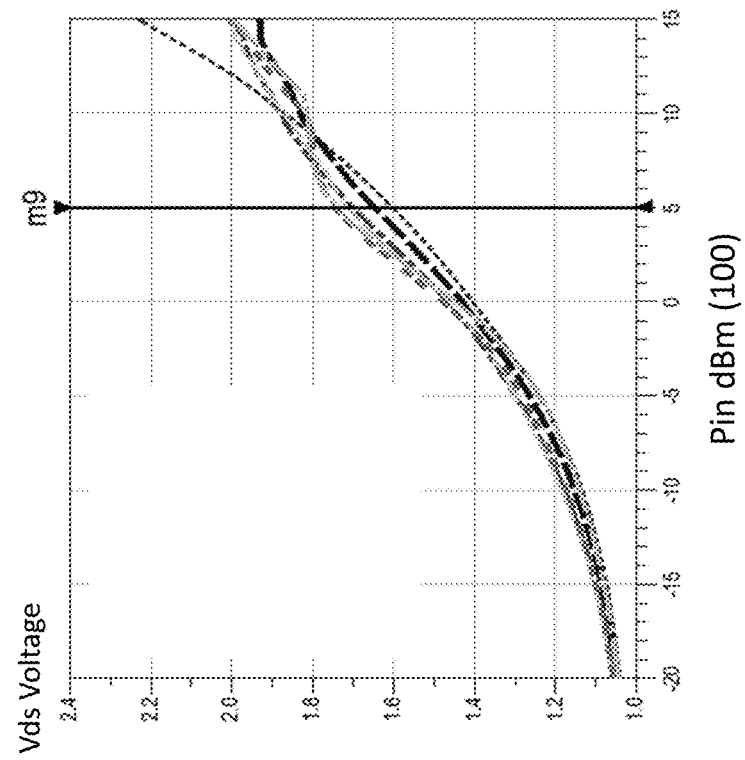
Figure 6D:
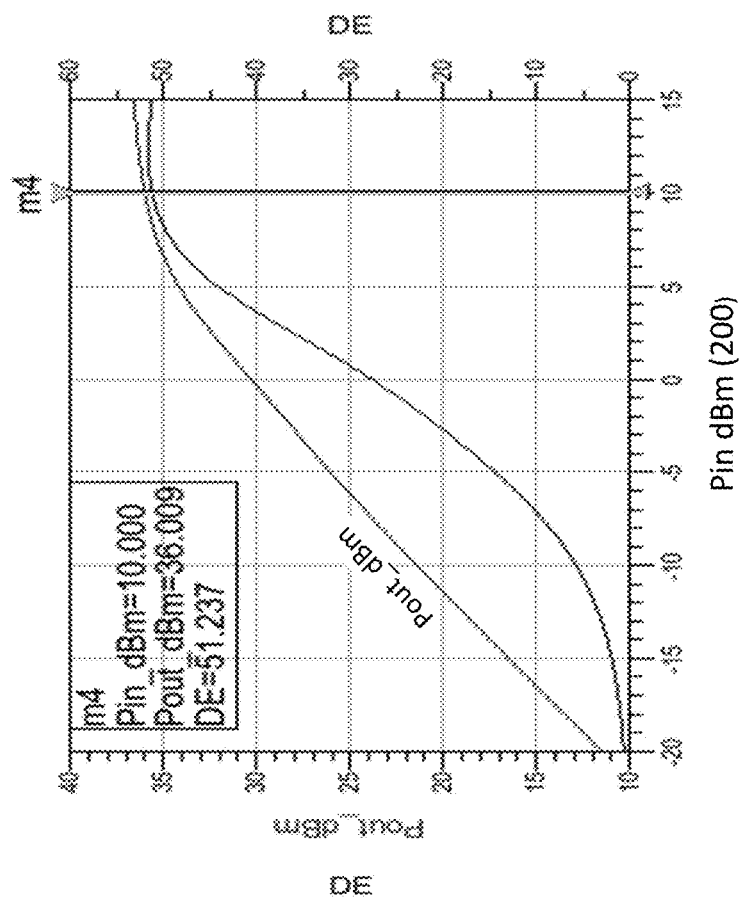
Figure 6C:
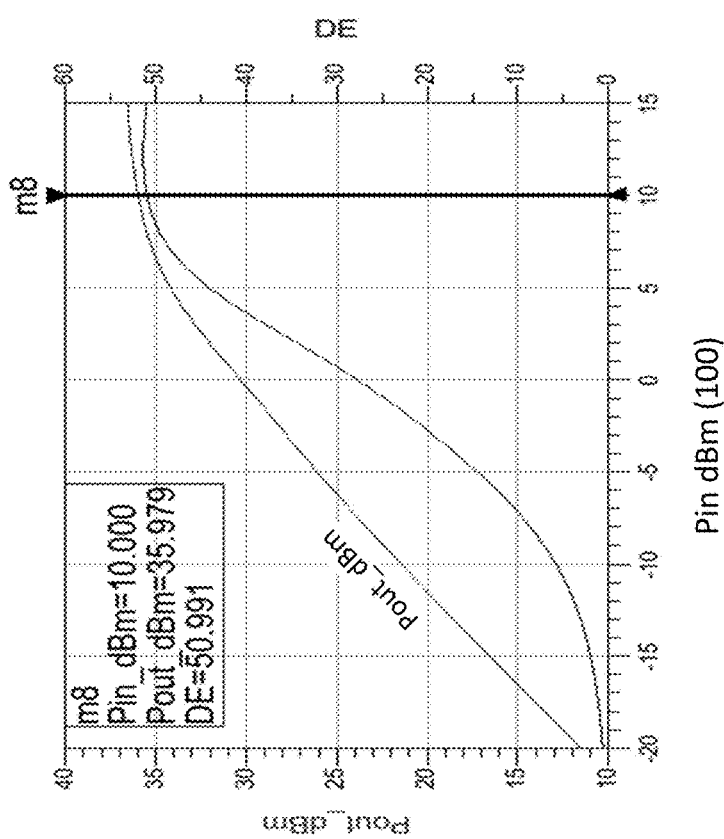

FIGS. 6A, 6B, 6C and 6D shows graphs representing simulated performances of the prior art RF amplifier (100) and the RF amplifier (200) according to the present disclosure. Such simulated performances are based on a distribution of the RF voltage at the drain of the output transistor M6 across the transistors of the stack (FIG. 6A for the RF amplifier 100 and FIG. 6B for the RF amplifier 200), and an output power (dBm) response and power added efficiency (PAE) (FIGS. 6C and 6D, where PAE is denoted by DE) of the RF amplifiers relative to an input power (dBm) to the amplifiers. As can be seen by the graphs of FIGS. 6A and 6B, biasing of the transistor stacks of the two RF amplifiers (100, 200) provide a substantially same voltage division (Vds1, Vds2, . . . , Vds6) with different gate capacitance values as described above, where low gate capacitance values of the RF amplifier (100) may render practical implementation of a corresponding integrated circuit difficult. Similarly, as can be seen by the graph of FIG. 6C (related to the RF amplifier 100) and the graph of FIG. 6D (related to the RF amplifier 200), output power response (denoted Pout_dBm) and PAE (denoted DE) of the two RF amplifier (100, 200) are substantially same. Such performance data show that the gate topology according to the present teachings can render realization of higher stack based RF amplifiers practical without sacrificing performance.

Figure 7:
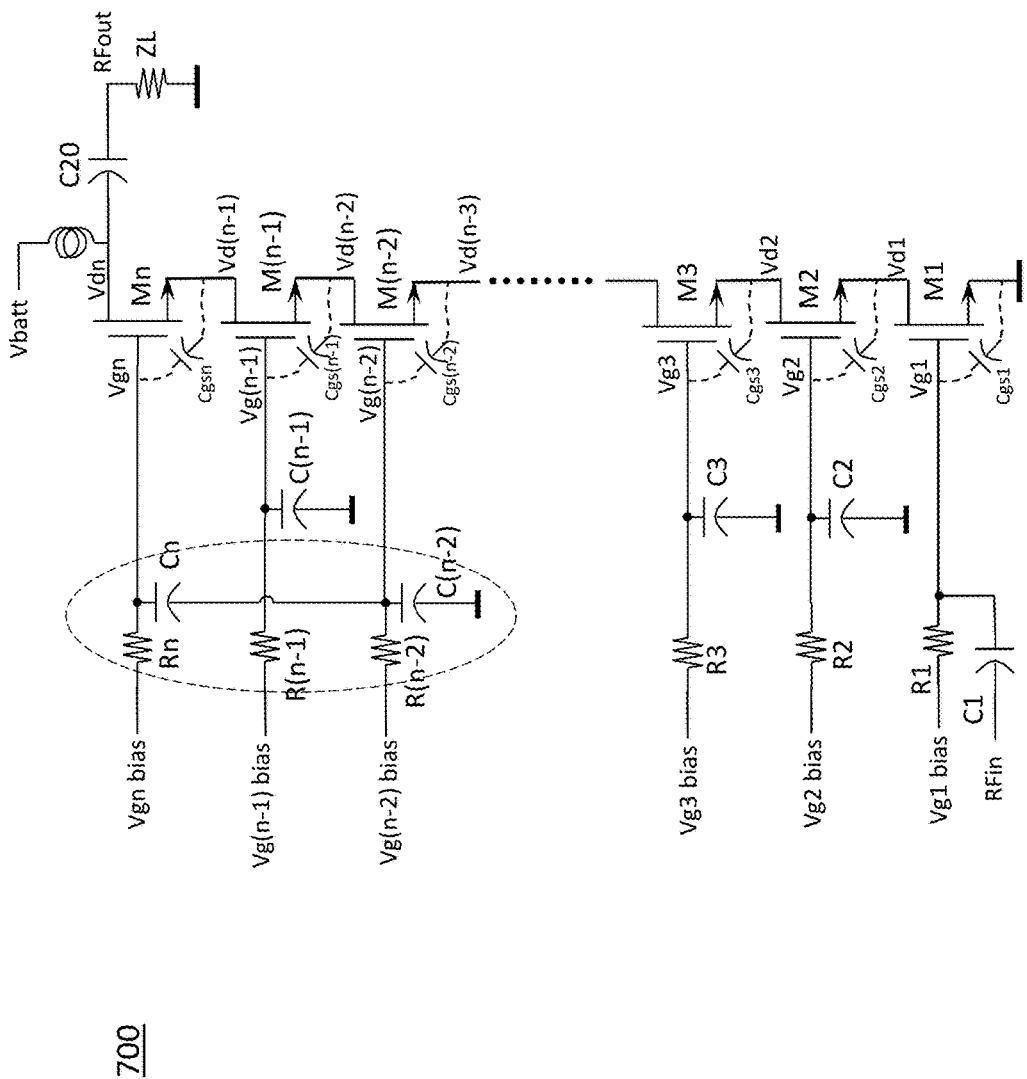
FIG. 7 shows a simplified schematic representation of an RF amplifier (700) according to an embodiment of the present disclosure, based on the embodiment of FIG. 3, where gate capacitors of non-adjacent transistors of a transistor stack comprising n transistors are coupled to allow for higher capacitance values of the gate capacitors while maintaining the desired distribution of the RF voltage at the drain of the output transistor Mn across the n transistors of the stack. In the exemplary embodiment depicted in FIG. 7, the gate capacitor Cn of the output transistor Mn is coupled to the gate capacitor C(n−2) of the transistor M(n−2).
Figure 8:
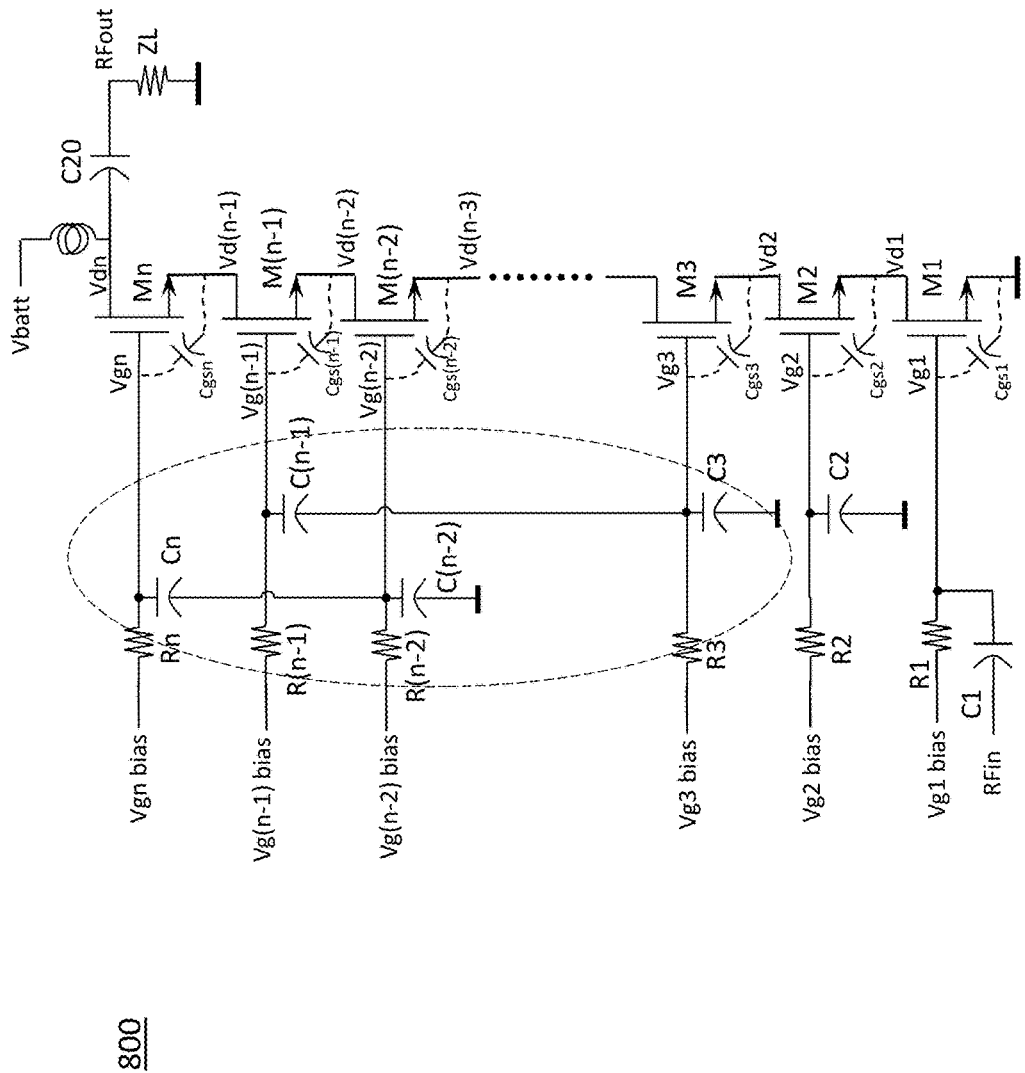
FIG. 8 shows a simplified schematic representation of an RF amplifier (800) according to an embodiment of the present disclosure, based on the embodiment of FIG. 7, where gate capacitors of non-adjacent transistors of a transistor stack comprising n transistors are coupled to allow for higher capacitance values of the gate capacitors while maintaining the desired distribution of the RF voltage at the drain of the output transistor Mn across the n transistors of the stack. In the exemplary embodiment depicted in FIG. 8, the gate capacitor Cn of the output transistor Mn is coupled to the gate capacitor C(n−2) of the transistor M(n−2), and the gate capacitor C(n−1) of the output transistor M(n−1) is coupled to the gate capacitor C3 of the transistor M3.

Although the various stack topologies according to the present teachings discussed above show coupling of gate capacitors of adjacent transistors of the stack, such exemplary embodiments should not be considered as limiting the present disclosure, as other topologies, where gate capacitors of non-adjacent stacks are coupled may also be envisioned, as shown, for example, in FIGS. 7 and 8. Coupling of gate capacitors can therefore be performed freely and an in view of design and performance goals. Accordingly, a combination of coupled gate capacitors of adjacent and non-adjacent transistors may be possible. For example, as shown in FIG. 7, the gate capacitor Cn of the output transistor Mn is coupled to the gate capacitor C(n−2) of the transistor M(n−2) and not to the gate capacitor C(n−1) of the adjacent transistor M(n−1). Based on a desired increase of the RF voltage swing at the upper gate node Vgn, voltage swings of lower gate nodes, e.g. Vg(n−2), can be provided by coupling associated gate capacitors (e.g. Cn and C(n−2)). FIG. 8 shows a stack topology based on one shown in FIG. 7, where in addition to the coupling between gate capacitors Cn and C(n−2), coupling of the gate capacitors C(n−1) and C3 is provided so to add to the RF voltage swing at the gate node Vg(n−1), the RF voltage swing at the gate node Vg3, and therefore, increase a capacitance value of the gate capacitor C(n−1) in view of a desired distribution of the RF voltage at the drain of the output transistor Mn across the transistors of stack.

Figure 9:
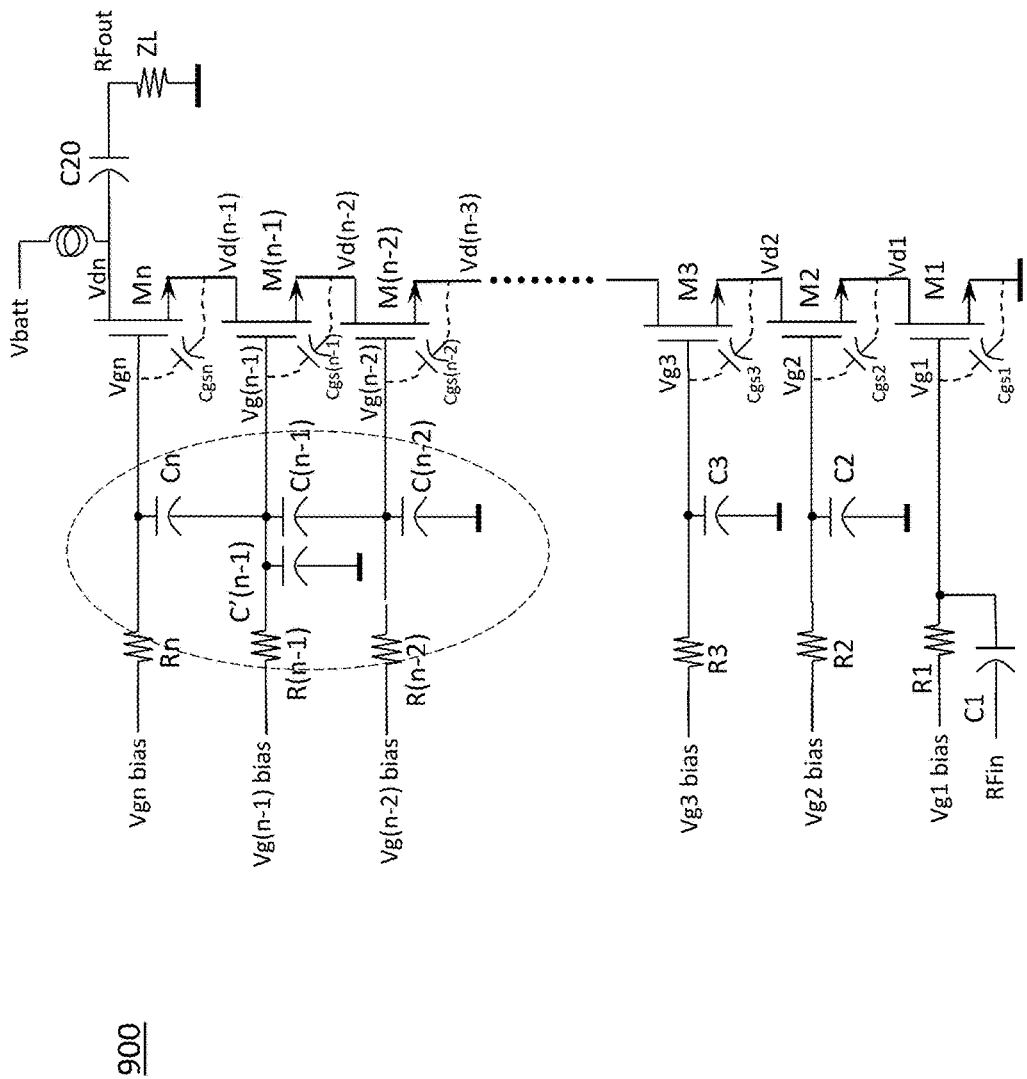
FIG. 9 shows a simplified schematic representation of an RF amplifier (900) according to an embodiment of the present disclosure, based on the embodiment of FIG. 3, where gate capacitors of transistors of a transistor stack comprising n transistors are coupled to allow for higher capacitance values of the gate capacitors while maintaining the desired distribution of the RF voltage at the drain of the output transistor Mn across the n transistors of the stack. In the exemplary embodiment depicted in FIG. 9, the gate capacitor Cn of the output transistor Mn is coupled to the gate capacitor C(n−1) of the transistor M(n−1) and to the gate capacitor C(n−2) of the transistor M(n−2). An additional gate capacitor C'(n−1), coupled to the gate of the transistor M(n−1), may be used to further adjust gate capacitance at the gate of the transistor M(n−1) so as to provide a desired effective voltage at the gate.

It should be noted that although in most cases stray/parasitic capacitances may be associated to corresponding uncontrollable and/or lowest possible capacitance values (e.g. inherent to design/implementation), it may also be possible to control values of such capacitances in order to further control the gate voltages for a desired distribution of the RF voltage at the drain of the output transistor of the stack. Accordingly, the gate capacitances may be considered associated to a combination of added capacitors and controlled/uncontrolled stray/parasitic capacitance. With reference to FIG. 9, an added gate capacitance, e.g. C'(n−1), may be provided to a gate of a transistor, e.g. M(n−1), of the transistor stack (M1, . . . , Mn), such as to further adjust the gate capacitance at the gate of the transistor (e.g. M(n−1)) so as to provide a desired effective RF voltage at the gate. As noted above, such added capacitance may be provided by any means known to a person skilled in the art, including via controlled stray/parasitic capacitance. Although the added capacitance is shown provided to the gate of the transistor M(n−1), a person skilled in the art would understand that similar added capacitance may be added to any of the gates of the cascode transistors (M2, M3, . . . , Mn) of the stack as required by design performance and goals.

Figure 10:
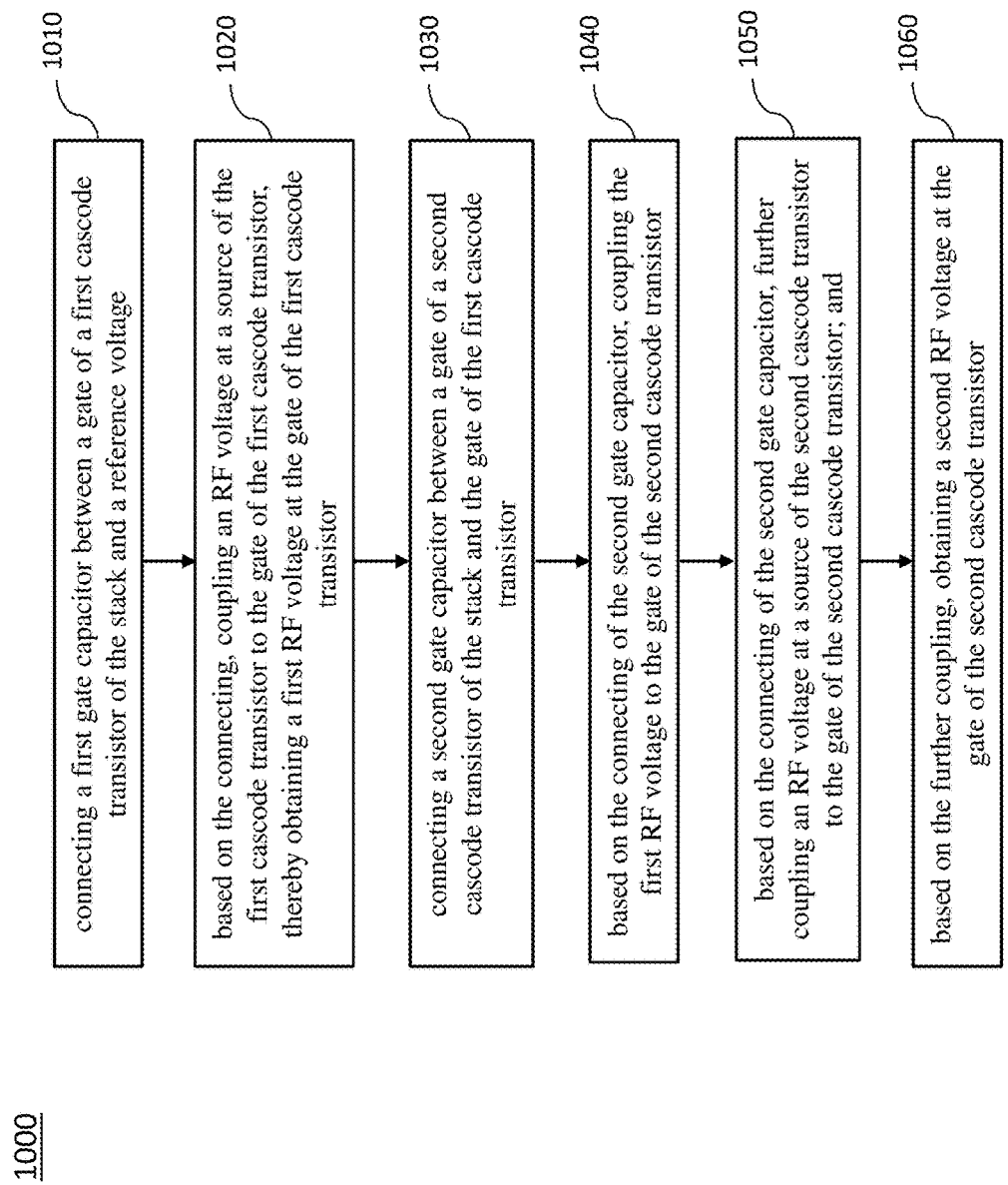
FIG. 10 is a process chart (1000) showing various steps of a method for realizing a monolithically integrated circuit comprising a stack of a plurality of transistors arranged in a cascode configuration according to an embodiment of the present disclosure.

FIG. 10 is a process chart (1000) showing various steps of a method for realizing a monolithically integrated circuit comprising a stack of a plurality of transistors arranged in a cascode configuration according to an embodiment of the present disclosure. As can be seen in the process chart (1000), the method comprises: connecting a first gate capacitor between a gate of a first cascode transistor of the stack and a reference voltage, per step 1010; based on the connecting, coupling an RF voltage at a source of the first cascode transistor to the gate of the first cascode transistor, thereby obtaining a first RF voltage at the gate of the first cascode transistor, per step 1020; connecting a second gate capacitor between a gate of a second cascode transistor of the stack and the gate of the first cascode transistor, per step 1030; based on the connecting of the second gate capacitor, coupling the first RF voltage to the gate of the second cascode transistor, per step 1040; based on the connecting of the second gate capacitor, further coupling an RF voltage at a source of the second cascode transistor to the gate of the second cascode transistor, per step 1050; and based on the further coupling, obtaining a second RF voltage at the gate of the second cascode transistor, per step 1060.

The embodiments as described herein are exemplified by an N-type MOSFET (NMOS) transistor device, as shown in the above described figures, used as a main conduction element of an RF amplifier (e.g. 100, 200). Such device can be part of a stack, where a plurality of such devices is connected in series so as to operate as a cascode, as shown, for example, in FIGS. 1 and 2. A person of ordinary skill in the art will readily apply the inventive concepts as disclosed herein to other types of semiconductor devices, such as a P-type MOSFET device. For example, in a case of a stack of P-type MOSFET (PMOS) devices, the supply voltage (e.g. Vbatt) may be coupled to the input transistor of the stack and the reference voltage coupled to the output transistor of the stack. In another example, the stack may include PMOS and NMOS devices, with PMOS devices between the supply and the output and NMOS devices from the output to reference (similar to a push-pull configuration), where any of the PMOS and NMOS transistors may use the above described gate capacitance topologies. Such topologies may equally apply to differential amplifiers using stacked transistors.

The embodiments, according to the present invention, can also be applied to extended drain devices, such as laterally diffused metal oxide semiconductor (LDMOS) devices, and other gated transistors or devices. According to various embodiments of the present disclosure, such FET devices may include metal-oxide-semiconductor (MOS) field effect transistors (FETs), complementary metal-oxide-semiconductor (CMOS) FETs, and particularly to MOSFETs and CMOSFETs fabricated on silicon-on-insulator (SOI) and silicon-on-sapphire (SOS) substrates, as well as bulk CMOS.

A person skilled in the art readily knows that an SOI MOSFET device (e.g. M1, M2, . . . , Mn) can be formed in a thin layer of silicon which overlies an insulating layer of an SOI substrate. Accordingly, and as known in the art, the SOI MOSFET device can be referred to as a thin-film SOI MOSFET, the thin-film referring to the thin layer of silicon. It should be noted that the various embodiments according to the present disclosure which will be described below can be implemented in thin-film SOI MOSFET devices. A more detailed description of such SOI MOSFET device can be found, for example, in the above referenced U.S. application Ser. No. 14/945,323, U.S. application Ser. No. 15/078,930, and U.S. Pat. No. 8,987,792 B2, whose disclosures are incorporated herein by reference in their entirety The term "MOSFET", as used in this disclosure, means any field effect transistor (FET) with an insulated gate and comprising a metal or metal-like-insulator-semiconductor structure. The terms "metal" or "metal-like" include at least one electrically conductive material (such as aluminum, copper, or other metal, or highly doped polysilicon, graphene, or other electrical conductor), "insulator" comprises at least one insulating material (such as silicon oxide, or other dielectric material), and "semiconductor" comprises at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz).

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A monolithically integrated circuital arrangement comprising:
   a stack of a plurality of transistors arranged in a cascode configuration, comprising an input transistor and N cascode transistors comprising an output transistor, N being an integer equal to or larger than two, the stack configured to operate between a supply voltage provided at a drain of the output transistor and a reference voltage provided at a source of the input transistor;
   a first gate capacitor connected, at a first terminal of the first gate capacitor, to a gate of a first transistor of the N cascode transistors, and connected, at a second terminal of the first gate capacitor, to a gate of a second transistor of the N cascode transistors; and
   a second gate capacitor, connected at a first terminal of the second gate capacitor, to the gate of the second transistor, and connected, at a second terminal of the second gate capacitor, to the reference voltage.

2. The monolithically integrated circuital arrangement according to claim 1, wherein:
   the arrangement is configured to operate as a radio frequency (RF) amplifier that provides an amplified version of an RF signal at a gate of the input transistor to a drain of the output transistor, and
   each gate capacitor of the first and second gate capacitors is configured to control an RF voltage amplitude at the gate of a respective one of the first transistor and the second transistor based on an RF voltage at a drain of the respective transistor and a desired distribution of the RF voltage across the stack.

3. The monolithically integrated circuital arrangement according to claim 2, wherein the RF voltage amplitude at the gate of the first transistor is further controlled by the second gate capacitor.

4. The monolithically integrated circuital arrangement according to claim 2, wherein:
   the second gate capacitor is configured to provide a portion of the RF voltage amplitude at the gate of the second transistor,
   the first gate capacitor is configured to provide a remaining portion of the RF voltage amplitude at the gate of the second transistor, and
   the remaining portion of the RF voltage amplitude is inversely proportional to a capacitance value of the first gate capacitor.

5. The monolithically integrated circuital arrangement according to claim 4, further comprising an additional gate capacitor connected between the gate of the first transistor and the reference voltage.

6. The monolithically integrated circuital arrangement according to claim 1, wherein the integer N is equal to or greater than 5.

7. The monolithically integrated circuital arrangement according to claim 6, wherein the first transistor is the output transistor.

8. The monolithically integrated circuital arrangement according to claim 2, wherein the desired distribution of the RF voltage across the stack is a substantially equal division of the RF voltage across the stack.

9. The monolithically integrated circuital arrangement according to claim 2, wherein the desired distribution of the RF voltage across the stack is an unequal division of the RF voltage across the stack.

10. The monolithically integrated circuital arrangement according to claim 1, wherein the plurality of transistors are metal-oxide-semiconductor (MOS) field effect transistors (FETs), or complementary metal-oxide-semiconductor (CMOS) field effect transistors (FETs).

11. The monolithically integrated circuital arrangement according to claim 10, wherein the plurality of transistors are fabricated using one of: a) silicon-on-insulator (SOI) technology, and b) silicon-on-sapphire technology (SOS).

12. The monolithically integrated circuital arrangement according to claim 1, wherein the plurality of transistors are of a same size.

13. The monolithically integrated circuital arrangement according to claim 1, wherein at least one transistor of the plurality of transistors is of a size different from remaining transistors of the plurality of transistors.

14. The monolithically integrated circuital arrangement according to claim 1, wherein:
   the stack comprises a plurality of unit cells arranged in a parallel configuration, each unit cell being a reduced size replica of the stack, and
   each gate capacitor of the first and second gate capacitors is distributed across the plurality of unit cells.

* * * * *